US006573785B1

(12) United States Patent
Callicotte et al.

(10) Patent No.: US 6,573,785 B1
(45) Date of Patent: Jun. 3, 2003

(54) METHOD, APPARATUS, AND SYSTEM FOR COMMON MODE FEEDBACK CIRCUIT USING SWITCHED CAPACITORS

(75) Inventors: Mark J. Callicotte, Sacramento, CA (US); Stephen C. Thilenius, Shingle Springs, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/038,482

(22) Filed: Jan. 3, 2002

(51) Int. Cl.[7] ................................. H03F 1/02
(52) U.S. Cl. ................. 330/9; 327/554; 330/69; 330/258
(58) Field of Search .............................. 330/9, 69, 258; 327/554

(56) References Cited

U.S. PATENT DOCUMENTS 5,410,270 A * 4/1995 Rybicki et al. ................ 330/9

OTHER PUBLICATIONS

Brown "Differential Amplifiers that Reject Common–mode Currents" IEEE Journal of Solid–State Circuits, vol. 6, Issue 6, Dec. 1971, pp 385–391.*

* cited by examiner

*Primary Examiner*—Michael B. Shingleton
(74) *Attorney, Agent, or Firm*—Blakely, Sokoloff, Taylor & Zafman LLP

(57) ABSTRACT

According to one aspect of the invention, an apparatus is provided which includes a first amplifier and a common mode feedback circuit. The first amplifier includes a first input, a second input, a first output, and a second output. The first input and the second input are coupled to receive a first input voltage and a second input voltage, respectively. The first and second outputs provide a first output voltage and a second output voltage, respectively. The common mode feedback circuit has first and second switched capacitors coupled to provide a common mode feedback signal based on the first and second output voltages to the first and second inputs of first amplifier.

26 Claims, 4 Drawing Sheets

METHOD, APPARATUS, AND SYSTEM FOR COMMON MODE FEEDBACK CIRCUIT USING SWITCHED CAPACITORS

FIELD OF THE INVENTION

The present invention relates to the field of switched capacitor filters design and implementation. More specifically, the present invention relates to a common mode feedback circuit using switched capacitors.

BACKGROUND OF THE INVENTION

In many filter designs, a differential amplifier can be used to improve the signal to noise ratio (SNR) and to improve immunity to noise coupling into the circuit. One of the drawbacks to differential amplifiers is the need for a common-mode feedback circuit. In order for the common-mode loop to be stable, the poles introduced in the common-mode loop need to be well above those of the differential loop. This can require large amounts of power and design complexity. A solution to this problem is to use two single-ended amplifiers with their positive inputs tied to the desired common-mode voltage. Generally, this circuit has the same properties as the fully differential design with respect to the SNR and noise immunity improvement without having to use a common-mode feedback structure.

One of the limitations on power consumption in switched capacitor circuits is the need to quickly charge switched capacitors to a desired accuracy in a limited period of time (e.g., half a clock cycle). Since the transfer function in a switched capacitor filter is based on capacitor ratios, the capacitors could be made as small as the photo-lithography and parasitic effects will permit without altering the transfer function. The true limit on capacitor sizes however, arises from the noise resulting from the resistive switch that is sampled onto the capacitor along with the desired signal. This noise power is inversely proportional to the switched capacitor value, hence for a required noise performance, a minimum capacitor size is indicated. This will also determine the capacitive load on the amplifiers in the switched-capacitor filter. For a given clock frequency and charge accuracy, the power required by the operational amplifiers (opamps) approximately scales with the square of the capacitor size. One way to reduce the capacitor size without degrading the noise performance is to use cross-sampling. Cross-sampling is a method where the switched capacitor is referenced to the inverse of the signal rather than an analog ground, effectively doubling the amount of charge transferred by the capacitor allowing the same transfer function to be realized with one-half the capacitance.

However, there is a problem in using the pseudo-differential and the cross-sampling methods in switched capacitor filter design because there is no common-mode information being transferred from the input to the output of the opamp. The common mode transfer function is not defined since there is no path for the input common mode to the output. In addition, there is no feedback of the output common mode voltage. In the presence of offsets, the output of the filter will saturate and the filter will no longer perform its intended function.

BRIEF DESCRIPTION OF THE DRAWINGS

The features of the present invention will be more fully understood by reference to the accompanying drawings, in which.

DETAILED DESCRIPTION

In the following detailed description numerous specific details are set forth in order to provide a thorough understanding of the present invention. However, it will be appreciated by one skilled in the art that the present invention may be understood and practiced without these specific details.

Figure 1:
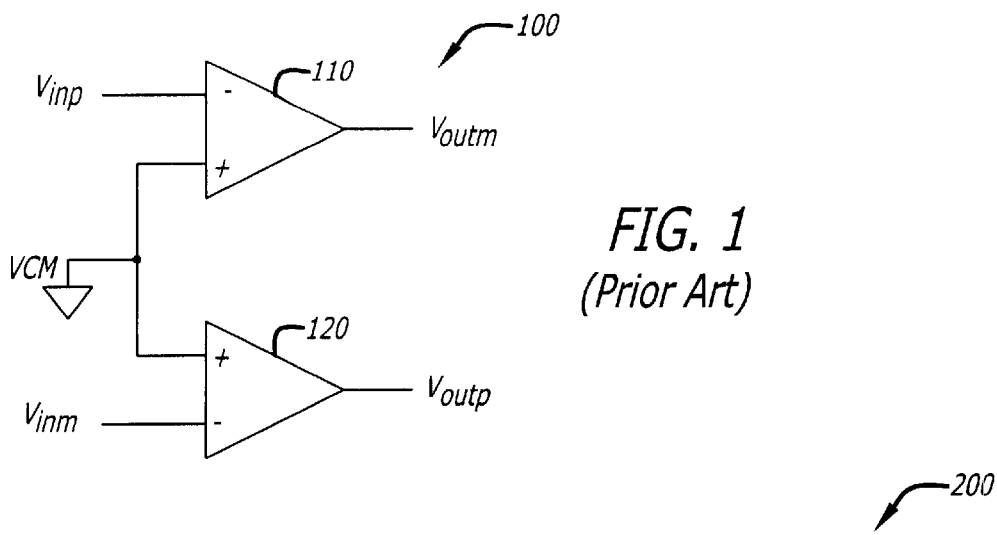
FIG. 1 shows a circuit diagram of a pseudo-differential amplifier used in filter design.

FIG. 1 shows a circuit diagram of a pseudo-differential amplifier 100 used in filter designs. As shown in FIG. 1, the pseudo-differential amplifier 100 includes two single-ended amplifiers 110 and 120 with their positive inputs tied to a desired common-mode voltage VCM. As mentioned above, this type of pseudo-differential amplifier circuit basically has the same properties as the fully differential design with respect to the SNR and noise immunity improvement without having to use a common-mode feedback structure.

Figure 2:
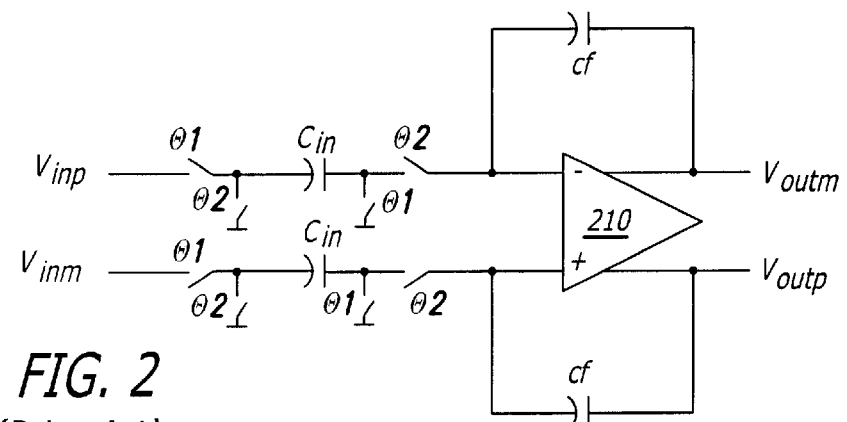
FIG. 2 illustrates a circuit diagram of a typical switched capacitor integrator.

FIG. 2 illustrates a circuit diagram of a typical switched capacitor integrator 200. As shown in FIG. 2, the two inputs Vinp and Vinm are coupled to the two respective input terminals of the opamp 210 via the respective switches $\Theta_1$, the respective capacitors Cin and the respective switches $\Theta_2$. The respective input terminals of the opamp 210 are coupled to the respective output terminals Voutm and Voutp, respectively, via the capacitors Cf.

The noise generated in the on resistance of the switches is sampled onto the capacitors Cin and then transferred to the integrating capacitors Cf. The noise and signal charges transferred on each clock phase are given below:

$$Q_{N,1}=\text{Noise charge sampled on } C_{IN} \text{ during } \Theta_1 = C_{IN}V_N = C_{IN}*\text{sqrt}(kT/C_{IN})=\text{sqrt}(kTC_{IN}) \quad \text{(Eq. 1)}$$

where $V_N$ is the noise voltage, k is the bozemans constant, T is the temperature (in Kelvin).

$$Q_{N,2}=\text{sqrt}(kTC_{IN}) \quad \text{(Eq. 2)}$$

$$Q_{SIG,1}=\text{Signal charge sampled on } C_{IN} \text{ during } \Theta_1 = C_{IN}*V_{IN} \quad \text{(Eq. 3)}$$

All of these charges are transferred to the integrating capacitor, but since the two noise charges are uncorrelated, their noise powers will add, not their noise charge. The output noise voltage and signal-to-noise ratio (SNR) is given below:

$$V_{OUT}=(C_{IN}V_{IN}+\text{sqrt}(2kTC_{IN}))/C_F \quad \text{(Eq. 4)}$$

$$SNR=(C_{IN}V_{IN}/C_F)/\text{sqrt}(2kTC_{IN})/C_F)=\text{sqrt}(C_{IN}/2kT) \quad \text{(Eq. 5)}$$

Figure 3:
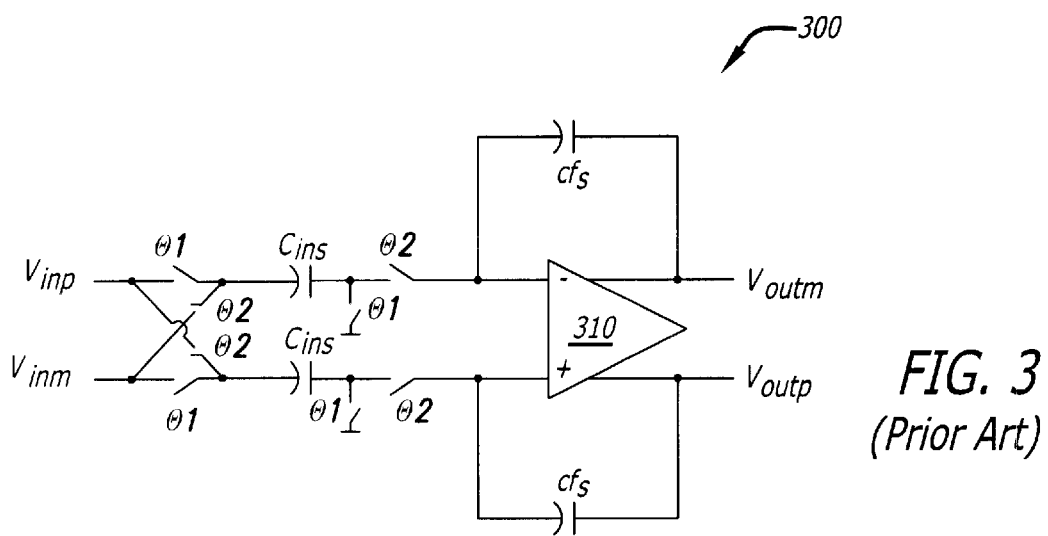
FIG. 3 shows a circuit diagram of a typical switched capacitor integrator with cross-sampling.

FIG. 3 shows a circuit diagram of a typical switched capacitor integrator with cross-sampling 300. The switched capacitor integrator 300 includes an opamp 310 having two input terminals and two output terminals. As described above, cross-sampling is one way to reduce the capacitor size in a switched capacitor filter without degrading the noise performance. In this cross-sampling configuration, the noise and signal charges transferred to the integrating capacitors are given below:

$Q_{N,1}$=Noise charge sampled on $C_{IN}$ during $\Theta_1$=$C_{INS}V_N$=
$C_{IN}$*sqrt($kT/C_{INS}$)=sqrt($kTC_{INS}$) (Eq. 6)

$Q_{N,2}$=sqrt($kTC_{INS}$) (Eq. 7)

$Q_{SIG,1}$=Signal charge sampled on $C_{IN}$ during $\Theta_1$=$C_{INS}*V_{IN}$ (Eq. 8)

$Q_{SIG,2}$=Signal charge sampled on $C_{IN}$ during $\Theta_2$=$C_{INS}*V_{IN}$ (Eq. 9)

As discussed above, the noise charges are uncorrelated, so their noise power, rather than their noise voltage, will add. The output voltage Vout and the SNR are given below:

$V_{OUT}$=(2$C_{INS}V_{IN}$+sqrt(2$kTC_{INS}$))/$C_{FS}$ (Eq. 10)

$SNR$=(2$C_{INS}V_{IN}/C_{FS}$)/sqrt(2$kTC_{INS}$)/$C_{FS}$)=sqrt(4$C_{INS}$/2$kT$) (Eq. 11)

It can be observed based upon the noise analysis of the switched capacitor integrators described above that the size of the switched capacitors may be reduced by a factor of four and the size of the integrating capacitors may be reduced by a factor of two, without degrading the signal-to-noise ratio (SNR).

As mentioned above, there exists a problem in using the pseudo-differential amplifier and the switched capacitor integrator with cross-sampling in switched capacitor design.

Figure 4:
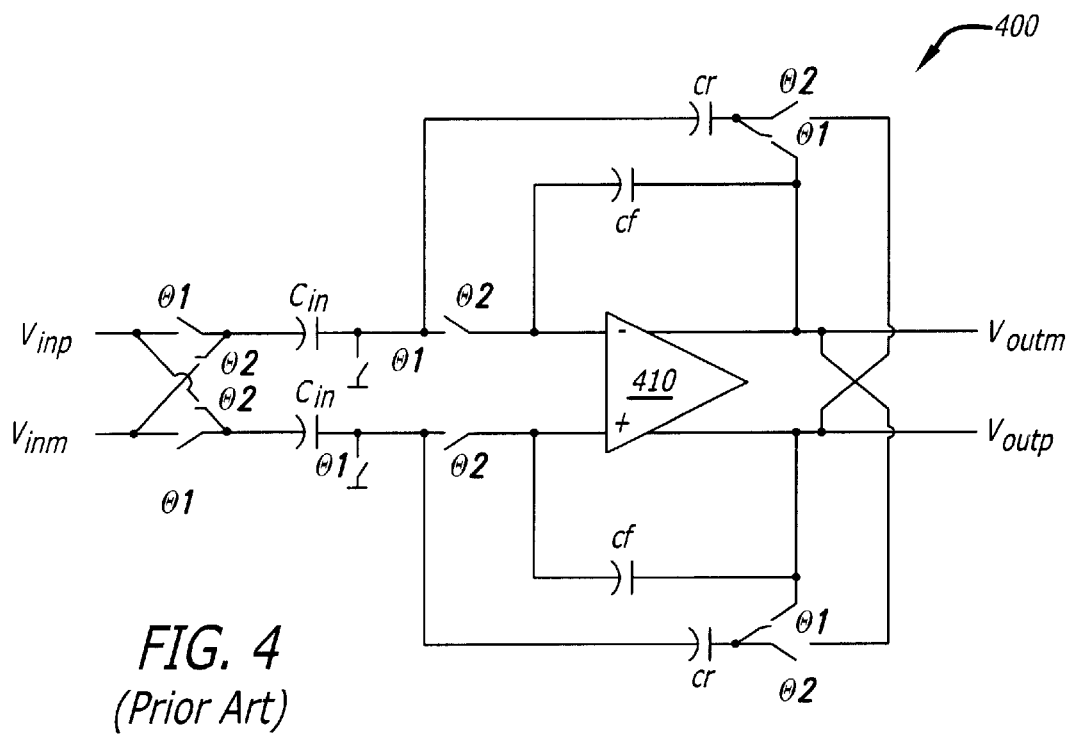
FIG. 4 shows a circuit diagram of a typical switched capacitor low pass filter with cross-sampling.

FIG. 4 shows a circuit diagram of a typical switched capacitor low pass filter 400 with cross-sampling. The low pass filter 400 includes an opamp 410 having two input terminals and two output terminals. As illustrated in FIG. 4, there is no common-mode information transferred from the input to the output of the low pass filter. Typically, the z-domain transfer function of the filter is shown in the following equations:

$V_{OUT, DIFF}$=$V_{OUTP}$−$V_{OUTM}$ (Eq. 12)

$V_{OUT, CM}$=($V_{OUTP}$+$V_{OUTM}$)/2 (Eq. 13)

$H_{DIFF}(z)$=$V_{OUT,DIFF}/V_{IN,DIFF}$=2*$C_{IN}$/(($C_R$+$C_F$)−($C_F$−$C_R$)$z^{-1}$) for low frequency input ($V_{IN, 1}$~$V_{IN, 2}$) (Eq. 14)

$H_{CM}(z)$=$V_{OUT, CM}/V_{IN, CM}$=Not Defined (Eq.15)

The common mode transfer function $H_{CM}(z)$ is not defined since there is no path for the input common mode to the output. Furthermore, there is no feedback of the output common mode voltage. In the presence of offsets, the output of the filter will saturate and the filter will no longer be able to perform its intended function.

Figure 5:
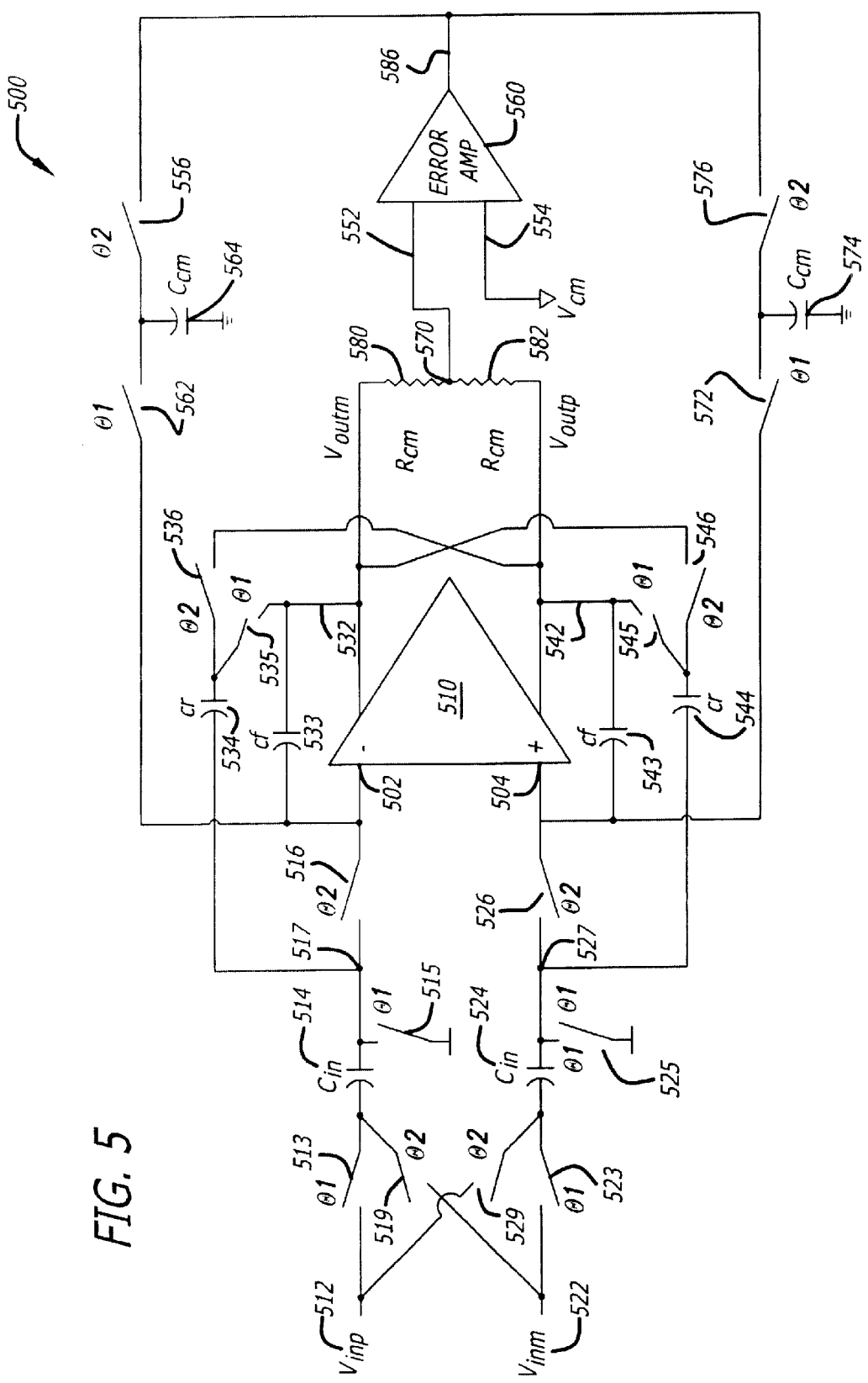
FIG. 5 shows a circuit diagram of one embodiment of a switched capacitor filter with common mode feedback, according to the teachings of the present invention.

FIG. 5 shows a circuit diagram of one embodiment of a switched capacitor filter with common mode feedback 500. According to the teachings of the present invention, in one embodiment, it is determined that the common mode output signal can be fed back without using the operational amplifier. Thus the problem with the common-mode loop setting the overall bandwidth of the amplifier can be avoided. Since only a DC offset needs to be fed back, the switched capacitor circuit as shown in FIG. 5 can be used to nullify the charge introduced by the offset. In one embodiment, the switched capacitor circuit 500 includes a differential amplifier (also called main amplifier herein) 510 and an operational amplifier (also called error amplifier herein) 560. The differential amplifier 510 includes input terminals 502, 504, and output terminal 532 which provides output voltage Voutm and output terminal 542 which provides output voltage Voutp, respectively. An input voltage Vinp 512 is coupled to a first terminal of a switch 513. A second terminal of the switch 513 is coupled to a first terminal (also called first end) of a capacitor 514. A second terminal (also called second end) of the capacitor 514 is coupled to a first terminal of a switch 516. A second terminal of the switch 516 is coupled to the input terminal 502 of the differential amplifier 510. As illustrated in FIG. 5, another input voltage Vinm 522 is coupled to a first terminal of a switch 523. A second terminal of the switch 523 is coupled to a first terminal (also called first end) of a capacitor 524. A second terminal (also called second end) of the capacitor 524 is coupled to a first terminal of a switch 526. A second terminal of the switch 526 is coupled to the input terminal 504 of the differential amplifier 510. The second terminal of the capacitor 514 is also connected to a first terminal of a switch 515. A second terminal of the switch 515 is connected to ground. Similarly, the second terminal of the capacitor 524 is also connected to a first terminal of a switch 525. A second terminal of the switch 525 is connected to ground.

Referring again to FIG. 5, the output terminal 532 is coupled to a first end of a capacitor 533 and to a first end of a switch 535. A second end of the capacitor 533 is coupled to the input terminal 502. A second end of the switch 535 is coupled to a first end of a capacitor 534. The first end of capacitor 534 is also coupled to a first end of a switch 536. A second end of the capacitor 534 is coupled to node 517 which is coupled to the second end of the capacitor 514 and the first end of the switch 516. A second end of the switch 536 is coupled to the output terminal 542 of the differential amplifier 510.

As shown in FIG. 5, the output terminal 542 is coupled to a first end of a capacitor 543 and to a first end of a switch 545. A second end of the capacitor 543 is coupled to the input terminal 504. A second end of the switch 545 is coupled to a first end of a capacitor 544. The first end of capacitor 544 is also coupled to a first end of a switch 546. A second end of the capacitor 544 is coupled to node 527 which is coupled to the second end of the capacitor 524 and the first end of the switch 526. A second end of the switch 546 is coupled to the output terminal 532 of the differential amplifier 510.

In one embodiment, the output terminal 532 is coupled to a first terminal of a resistor 580. A second terminal of the resistor 580 is coupled to node 570 which is connected to an input terminal of the error amplifier 560. The output terminal 542 is coupled to a first terminal of a resistor 582. A second terminal of the resistor 582 is also coupled to node 570. The other input terminal of the error amplifier 560 is connected to a common mode reference voltage Vcm. The output terminal 586 of the error amplifier 560 is coupled to a first end of a switch 566. The second end of the switch 566 is coupled to a first end of a capacitor 564 and a first end of a switch 562. A second end of the switch 562 is coupled to the input terminal 502 of the differential amplifier 510. A second end of the capacitor 564 is coupled to ground level. The output terminal 586 is also coupled to a first end of a switch 576. A second end of the switch 576 is coupled to a first end of a capacitor 574 and a first end of a switch 572. A second end of the switch 572 is coupled to the input terminal 504 of the differential amplifier 510. A second end of the capacitor 574 is coupled to ground level.

In one embodiment, all the switches illustrated in FIG. 5 are turned on (closed) or turned off (open) in response to a corresponding control signal. For example, switches 513, 523, 515, 525, 535, 545, 562, and 572 are operated in response to a control signal $\Theta_1$. Switches 516, 526, 519, 529, 536, 546, 566, and 576 are operated in response to a control signal $\Theta_2$. In one embodiment, control signals $\Theta_1$ and $\Theta_2$ are non-overlapping clock signals. Switches illustrated in FIG. 5 can be any type of switching devices suitable for implementation in switched capacitor circuits in accordance with the teachings of the present invention. For example, various types of switching transistors can be used depending upon the particular applications or implementations of the present invention.

In one embodiment, when the control signal $\Theta_1$ is at a first level (e.g., high logic level) and the control signal $\Theta_2$ is at a second level (e.g., low logic level), switches 513, 523, 515, 525, 535, 545, 562, and 572, etc. are turned on or closed. When the control signal $\Theta_1$ is at a second level (e.g., low logic level) and the control signal $\Theta_2$ is at a first level (e.g., high logic level), switches 516, 526, 519, 529, 536, 546, 566, and 576, etc. are turned on or closed.

In operation, when switches 513 and 523 are turned on (closed), the Vinp input voltage is connected to the first terminal of the capacitor 514 and the Vinm input voltage is connected to the first terminal of the capacitor 524, respectively. The second terminals of capacitors 514 and 524 are connected to ground. When switches 516, 526, 519, and 529 are turned on (closed), the second terminal of capacitor 514 is connected to the input terminal 502 and the second terminal of capacitor 524 is connected to input terminal 504, respectively. At this time, the Vinp input voltage is connected to the first terminal of capacitor 524 and the Vinm input voltage is connected to the first terminal of capacitor 514, respectively. A common mode output voltage at node 570 is coupled to input terminal 552 of the error amplifier 560 while the input terminal 554 is coupled to a common mode reference voltage Vcm. The error amplifier 560, in one embodiment, operates to compares the common mode output voltage at node 570 to the common mode reference voltage Vcm. When the switches 566 and 576 are closed, the output of the error amplifier 560 is coupled to capacitors 564 and 574, respectively. When switches 562 and 572 are closed, capacitors 564 and 574 are coupled to the input terminals 502 and 504 of the main amplifier 510, respectively. Accordingly, the switched capacitors 564 and 574 function to provide feedback of the common mode voltage for the differential amplifier 510. Since the error amplifier 560 can have very low bandwidth and the feedback capacitors 564 and 574 can be made very small, the additional power consumption by the common mode feedback loop in the configuration illustrated in FIG. 5 will be negligible. In addition, the common mode sensing resistors 580 and 582 can be made very large to make their impact on the differential amplifier 510 negligible as well. The differential mode transfer function is unchanged. It can be appreciated and understood by one skilled in the art that, in accordance with the teachings of the present invention, the common mode output signal can be fed back without using the main amplifier 510. Thus the problem with the common-mode loop setting the overall bandwidth of the main amplifier 510 can be avoided. Since only a DC offset needs to be fed back, the switched capacitor circuit as shown in FIG. 5 can be used to nullify the charge introduced by the offset.

Figure 6:
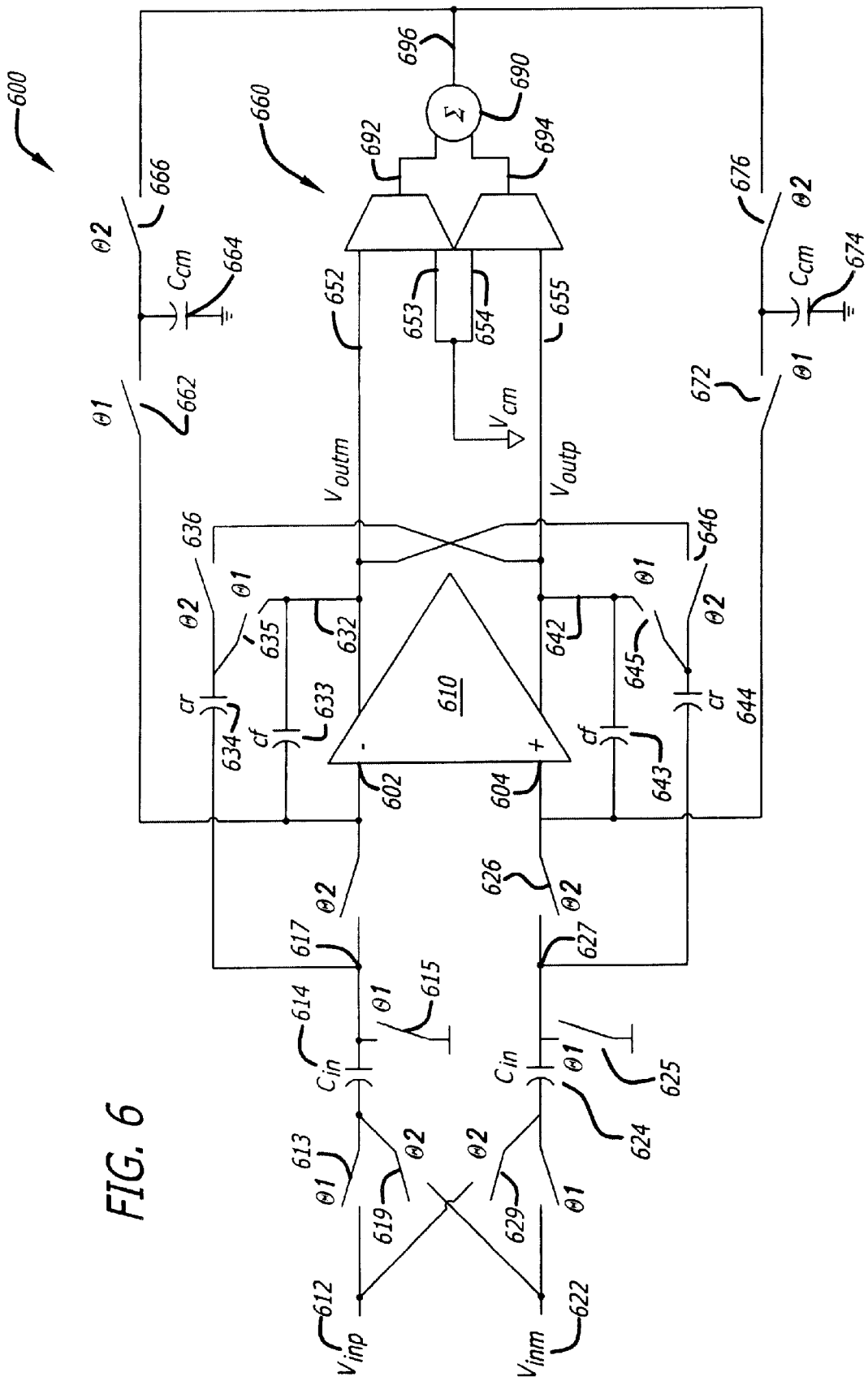
FIG. 6 illustrates a circuit diagram of another embodiment of a switched capacitor filter with common mode feedback, in accordance with the teachings of the present invention.

FIG. 6 shows a circuit diagram of another embodiment of a switched capacitor filter with common mode feedback 600, according to the teachings of the present invention. In one embodiment, the switched capacitor circuit 600 includes a differential amplifier (also called main amplifier herein) 610, a pseudo-differential amplifier 660, and an adder 690. The differential amplifier 610 has two input terminals 602, 604, and output terminal 632 which provides output voltage Voutm and output terminal 642 which provides output voltage Voutp, respectively. In one embodiment, an input voltage Vinp 612 is coupled to a first terminal of a switch 613. A second terminal of the switch 613 is coupled to a first terminal (also called first end) of a capacitor 614. A second terminal (also called second end) of the capacitor 614 is coupled to a first terminal of a switch 616. A second terminal of the switch 616 is coupled to the input terminal 602 of the differential amplifier 610. In one embodiment, another input voltage Vinm 622 is coupled to a first terminal of a switch 623. A second terminal of the switch 623 is coupled to a first terminal (also called first end) of a capacitor 624. A second terminal (also called second end) of the capacitor 624 is coupled to a first terminal of a switch 626. A second terminal of the switch 626 is coupled to the input terminal 604 of the differential amplifier 610. The second terminal of the capacitor 614 is also connected to a first terminal of a switch 615. A second terminal of the switch 615 is connected to ground. Similarly, the second terminal of the capacitor 624 is also connected to a first terminal of a switch 625. A second terminal of the switch 625 is connected to ground.

In one embodiment, as shown in FIG. 6, the output terminal 632 is coupled to a first end of a capacitor 633 and to a first end of a switch 635. A second end of the capacitor 633 is coupled to the input terminal 602. A second end of the switch 635 is coupled to a first end of a capacitor 634. The first end of capacitor 634 is also coupled to a first end of a switch 636. A second end of the capacitor 634 is coupled to node 617 which is coupled to the second end of the capacitor 614 and the first end of the switch 616. A second end of the switch 636 is coupled to the output terminal 642 of the differential amplifier 610.

In one embodiment, as shown in FIG. 6, the output terminal 642 is coupled to a first end of a capacitor 643 and to a first end of a switch 645. A second end of the capacitor 643 is coupled to the input terminal 604. A second end of the switch 645 is coupled to a first end of a capacitor 644. The first end of capacitor 644 is also coupled to a first end of a switch 646. A second end of the capacitor 644 is coupled to node 627 which is coupled to the second end of the capacitor 624 and the first end of the switch 626. A second end of the switch 646 is coupled to the output terminal 632 of the differential amplifier 610.

Referring again to FIG. 6, in one embodiment, the output terminals 632 and 642 are coupled to the negative inputs 652 and 655 of the pseudo-differential amplifier 660, respectively. The positive inputs 653 and 654 of the pseudo-differential amplifier 660 are coupled to a common mode reference voltage Vcm. The output terminals 692 and 694 of the pseudo-differential amplifier 660 are coupled to the inputs of the adder 690. In one embodiment, the output terminal 696 of the adder 690 is coupled to a first end of a switch 666. The second end of the switch 666 is coupled to a first end of a capacitor 664 and a first end of a switch 662. A second end of the switch 662 is coupled to the input terminal 602 of the differential amplifier 610. A second end of the capacitor 664 is coupled to ground level. The output terminal 696 is also coupled to a first end of a switch 676. A second end of the switch 676 is coupled to a first end of a capacitor 674 and a first end of a switch 672. A second end of the switch 672 is coupled to the input terminal 604 of the differential amplifier 610. A second end of the capacitor 674 is coupled to ground level.

In one embodiment, all the switches illustrated in FIG. 6 are turned on (closed) or turned off (open) in response to a corresponding control signal. For example, switches 613, 623, 615, 625, 635, 645, 662, and 672 are operated in response to a control signal $\Theta_1$. Switches 616, 626, 619, 629, 636, 646, 666, and 676 are operated in response to a control signal $\Theta_2$. In one embodiment, control signals $\Theta_1$ and $\Theta_2$ are non-overlapping clock signals. Switches illustrated in FIG. 6 can be any type of switching devices suitable for implementation in switched capacitor circuits in accordance with the teachings of the present invention. For example, various types of switching transistors can be used depending upon the particular applications or implementations of the present invention.

In one embodiment, when the control signal $\Theta_1$ is at a first level (e.g., high logic level) and the control signal $\Theta_2$ is at a second level (e.g., low logic level), switches 613, 623, 615, 625, 635, 645, 662, and 672, etc. are turned on or closed. When the control signal $\Theta_1$ is at a second level (e.g., low logic level) and the control signal $\Theta_2$ is at a first level (e.g., high logic level), switches 616, 626, 619, 629, 636, 646, 666, and 676, etc. are turned on or closed.

In operation, when switches 613 and 623 are turned on (closed), the Vinp input voltage is connected to the first terminal of the capacitor 614 and the Vinm input voltage is connected to the first terminal of the capacitor 624, respectively. The second terminals of capacitors 614 and 624 are connected to ground. When switches 616, 626, 619, and 629 are turned on (closed), the second terminal of capacitor 614 is connected to the input terminal 602 and the second terminal of capacitor 624 is connected to input terminal 604, respectively. At this time, the Vinp input voltage is connected to the first terminal of capacitor 624 and the Vinm input voltage is connected to the first terminal of capacitor 614, respectively. When the switches 666 and 676 are closed, the output of the adder 690 is coupled to capacitors 664 and 674, respectively. When the switches 662 and 672 are closed, the capacitors 664 and 674 are coupled to the input terminals 602 and 604, respectively. Accordingly, the switched capacitors 664 and 674 function to provide feedback of the common mode voltage for the differential amplifier 610. Since the pseudo-differential amplifier 690 can have very low bandwidth and the feedback capacitors 664 and 674 can be made very small, the additional power consumption by the common mode feedback loop in the configuration illustrated in FIG. 6 will be negligible. The differential mode transfer function is unchanged.

It can be appreciated and understood by one skilled in the art that, in accordance with the teachings of the present invention, the common mode output signal can be fed back without using the main amplifier 610. Thus the problem with the common-mode loop setting the overall bandwidth of the main amplifier 610 can be avoided. Since only a DC offset needs to be fed back, the switched capacitor circuit as shown in FIG. 6 can be used to nullify the charge introduced by the offset.

Figure 7:
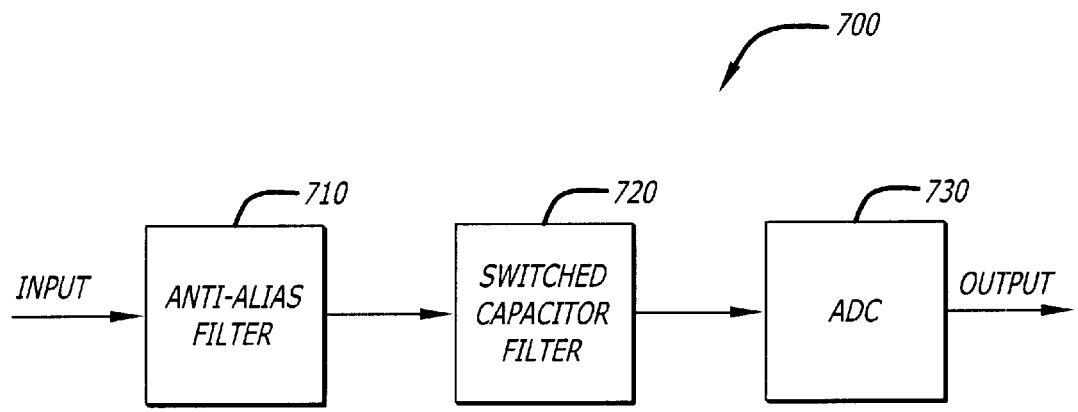
FIG. 7 shows a block diagram of a system 700 in which the teachings of the present invention are implemented.

FIG. 7 shows a block diagram of a system 700 in which the teachings of the present invention are implemented. The system 700, in one embodiment, may represent an example of a baseband channel circuitry employed in various wireless communication systems. As shown in FIG. 7, the system 700 includes an anti-alias filter unit 710, a switched capacitor filter unit 720, and an analog-to-digital conversion (ADC) unit 730. In one embodiment, the anti-alias filter unit 710 is a continuous time active-RC filter that is used to perform coarse filtering of the input signals (e.g., RF signals). In one embodiment, the switched capacitor filter unit 720 is configured as described above with respect to FIGS. 5 and 6, in accordance with the teachings of the present invention. The switched capacitor filter unit 720 can be used to perform channel selection by filtering out nearby adjacent channels of the output signals from the anti-alias filter unit 710. The ADC unit 730 is used to digitize the output analog signals generated by the switched capacitor filter unit 720 prior to the digital signal processing stage.

The invention has been described in conjunction with the preferred embodiment. It is evident that numerous alternatives, modifications, variations and uses will be apparent to those skilled in the art in light of the foregoing description.

What is claimed is:

1. An apparatus comprising:
    a first amplifier including a first input, a second input, a first output, and a second output, the first input and the second input to receive a first input voltage and a second input voltage, respectively, and the first and second outputs to provide a first output voltage and a second output voltage, respectively;
    a common mode feedback circuit having first and second switched capacitors coupled to provide a common mode feedback signal based on the first and second output voltages to the first and second inputs of first amplifier;
    a third capacitor coupled between the first input and the first output of the first amplifier; and
    a fourth capacitor coupled between the second input and the second output of the first amplifier.

2. The apparatus of claim 1 further including:
    a fifth capacitor alternately coupled between the first input and the first output during a first period and coupled between the first input and the second output during a second period; and
    a sixth capacitor alternately coupled between the second input and the second output during the first period and coupled between the second input and the first output during the second period.

3. An apparatus comprising:
    a first amplifier including a first input, a second input, a first output, and a second output, the first input and the second input to receive a first input voltage and a second input voltage, respectively, and the first and second outputs to provide a first output voltage and a second output voltage, respectively; and
    a common mode feedback circuit having first and second switched capacitors coupled to provide a common mode feedback signal based on the first and second output voltages to the first and second inputs of first amplifier,
    wherein the first and second input voltages are alternately coupled to the first input and the second input of the first amplifier, based on first and second control signals.

4. The apparatus of claim 3 wherein the first and second control signals are non-overlapping clock signals.

5. An apparatus comprising:
    a first amplifier including a first input, a second input, a first output, and a second output, the first input and the second input to receive a first input voltage and a second input voltage, respectively, and the first and second outputs to provide a first output voltage and a second output voltage, respectively; and
    a common mode feedback circuit having first and second switched capacitors coupled to provide a common mode feedback signal based on the first and second output voltages to the first and second inputs of first amplifier, wherein the common mode feedback circuit includes a component to generate the common mode feedback signal based on the first output voltage, the second output voltage, and a common mode reference voltage, wherein the common mode feedback signal is coupled to the first capacitor via a first switch and coupled to the second capacitor via a second switch, and wherein the first capacitor is coupled to the first input via a third switch and the second capacitor is coupled to the second input via a fourth switch.

6. The apparatus of claim 5 wherein the third and fourth switches are turned on and off based upon a value of a first control signal.

7. The apparatus of claim 6 wherein the first and second switches are turned on and off based upon a value of a second control signal.

8. An apparatus comprising:

a first amplifier including a first input, a second input, a first output, and a second output, the first input and the second input to receive a first input voltage and a second input voltage, respectively, and the first and second outputs to provide a first output voltage and a second output voltage, respectively; and a common mode feedback circuit having first and second switched capacitors coupled to provide a common mode feedback signal based on the first and second output voltages to the first and second inputs of first amplifier, wherein the common mode feedback circuit includes a component to generate the common mode feedback signal based on the first output voltage, the second output voltage, and a common mode reference voltage, and wherein the component includes a second amplifier having a first input and a second input, the first input being coupled to a common mode output voltage corresponding to a low-pass filtered version of the difference between the first output voltage and the second output voltage, the second input being coupled to the common mode reference voltage.

9. The apparatus of claim 8 wherein the second amplifier is an error amplifier.

10. An apparatus comprising:

a first amplifier including a first input, a second input, a first output, and a second output, the first input and the second input to receive a first input voltage and a second input voltage, respectively, and the first and second outputs to provide a first output voltage and a second output voltage, respectively; and a common mode feedback circuit having first and second switched capacitors coupled to provide a common mode feedback signal based on the first and second output voltages to the first and second inputs of first amplifier, wherein the common mode feedback circuit includes a component to generate the common mode feedback signal based on the first output voltage, the second output voltage, and a common mode reference voltage, and wherein the component includes:

a pseudo-differential amplifier having first and second negative inputs, first and second positive inputs, the first and second negative inputs being coupled to the first and second output voltages, respectively, the first and second positive inputs being coupled to a common reference voltage; and an adder coupled to generate the common mode feedback signal based on first and second outputs of the pseudo-differential amplifier.

11. A method comprising:

receiving a first output voltage and a second output voltage from a first amplifier;

coupling the first and second output voltages to a first negative input and second negative input of a pseudo-differential amplifier, respectively;

generating a common mode feedback signal based on a first output and a second output of the pseudo-differential amplifier; and providing the common mode feedback signal to a first input and a second input of the first amplifier via a first switched capacitor and a second switched capacitor, respectively.

12. A method comprising:

receiving a first output voltage and a second output voltage from a first amplifier;

generating a common mode feedback signal based on the first and second output voltages; and providing the common mode feedback signal to first and second inputs of the first amplifier via first and second switched capacitors, respectively, wherein generating the common mode feedback signal including:

coupling a third voltage corresponding to a low-pass filtered version of the difference between the first and second output voltages to a first input of a second amplifier;

coupling a second input of the second amplifier to a common mode reference voltage; and generating the common mode feedback signal based on the difference between the third voltage and the common mode reference voltage.

13. A method comprising:

receiving a first output voltage and a second output voltage from a first amplifier;

generating a common mode feedback signal based on the first and second output voltages; and providing the common mode feedback signal to first and second inputs of the first amplifier via first and second switched capacitors, respectively, including:

coupling the common mode feedback signal to first and second capacitors via first and second switches, respectively; and coupling first and second capacitors to first and second capacitors to first and second inputs of the first amplifier via third and fourth switches.

14. The method of claim 13 wherein the third and fourth switches are turned on to couple the first and second capacitors to first and second inputs of the first amplifier, respectively, and turned off to decouple the first and second capacitors from first and second inputs of the first amplifier, respectively.

15. The method of claim 14 wherein the third and fourth switches are turned on and off based on the value of a first control signal.

16. The method of claim 15 wherein the first and second switches are turned on to couple the common mode feedback signal to the first and second capacitors, respectively, and turned off to decouple the common mode feedback signal from the first and second capacitors, respectively.

17. The method of claim 16 wherein the first and second switches are turned on and off based on the value of a second control signal.

18. The method of claim 17 wherein first and second control signals are non-overlapping clock signals.

19. A system comprising:

a first filter to perform coarse filtering of input signals;

a second filter coupled to the first filter to perform channel selection of the output signals generated by the first filter, the second filter including:

a first amplifier including a first input, a second input, a first output, and a second output, the first input and the second input to receive a first input voltage and a second input voltage, respectively, and the first and second outputs to provide a first output voltage and a second output voltage, respectively; and a common mode feedback circuit having first and second switched capacitors coupled to provide a common made feedback signal based on the first and second output voltages to the first and second inputs of first amplifier; and an analog-to-digital converter (ADC) coupled to the second filter to digitize the output of the second filter.

20. The system of claim 19 further including:

a third capacitor coupled between the first input and the first output of the first amplifier; and a fourth capacitor coupled between the second input and the second output of the first amplifier.

21. The system of claim 20 further including:

a fifth capacitor alternately coupled between the first input and the first output during a first period and coupled between the first input and the second output during a second period; and a sixth capacitor alternately coupled between the second input and the second output during the first period and coupled between the second input and the first output during the second period.

22. The system of claim 19 wherein the first and second input voltages are alternately coupled to the first input and the second input of the first amplifier, based on first and second control signals.

23. The system of claim 19 wherein the common mode feedback circuit includes a component to generate the common mode feedback signal based on the first output voltage, the second output voltage, and a common mode reference voltage.

24. The system of claim 23 wherein the component includes:

a second amplifier having a first input and a second input, the first input being coupled to a common mode output voltage corresponding to a low-pass filtered version of the difference between the first output voltage and the second output voltage, the second input being coupled to the common mode reference voltage.

25. The system of claim 24 wherein the second amplifier is an error amplifier.

26. The system of claim 23 wherein the component includes:

a pseudo-differential amplifier having first and second negative inputs, first and second positive inputs, the first and second negative inputs being coupled to the first and second output voltages, respectively, the first and second positive inputs being coupled to a common reference voltage; and an adder coupled to generate the common mode feedback signal based on first and second outputs of the pseudo-differential amplifier.

* * * * *